(12) United States Patent  
Wong et al.

(10) Patent No.: US 11,728,191 B2  
(45) Date of Patent: Aug. 15, 2023

(54) FRONT SURFACE AND BACK SURFACE ORIENTATION DETECTION OF TRANSPARENT SUBSTRATE

(71) Applicant: Applied Materials, Inc., Santa Clara, CA (US)

(72) Inventors: Michelle Alejandra Wong, Fremont, CA (US); Sanjay Rajaram, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 734 days.

(21) Appl. No.: 15/929,493

(22) Filed: May 5, 2020

(65) Prior Publication Data

US 2021/0351050 A1 Nov. 11, 2021

(51) Int. Cl.
*H01L 21/67* (2006.01)
*H01L 21/68* (2006.01)

(52) U.S. Cl.
CPC .. *H01L 21/67184* (2013.01); *H01L 21/67242* (2013.01); *H01L 21/67259* (2013.01);
(Continued)

(58) Field of Classification Search
CPC ......... H01L 21/67184; H01L 21/67259; H01L 21/67282; H01L 21/67294; H01L 21/681;
(Continued)

(56) References Cited

U.S. PATENT DOCUMENTS

| 7,737,426 B2 * | 6/2010 | Takahashi | H01L 21/681 250/559.36 |
| 2008/0181752 A1 * | 7/2008 | Takahashi | H01L 21/681 700/114 |
| 2010/0228371 A1 * | 9/2010 | Takahashi | H01L 21/681 700/114 |

FOREIGN PATENT DOCUMENTS

| JP | 2002367871 | 12/2002 |
| JP | 2002367871 A * | 12/2002 |

(Continued)

OTHER PUBLICATIONS

Kim, Jongwon, "New Wafer Alignment Process Using Multiple Vision Method for Industrial Manufacturing," Electronics 2018, 7, 39; doi :10.3390/electronics7030039, www.mdpi.com/journal/electronics, 11 pages, published Mar. 11, 2018.

(Continued)

*Primary Examiner* — Ermias T Woldegeorgis
(74) *Attorney, Agent, or Firm* — Lowenstein Sandler LLP

(57) ABSTRACT

A system includes a substrate support on which to receive a transparent substrate, a non-contact sensor adapted to detect and image a dot pattern etched on a front surface of the transparent substrate, and a processing device attached to the non-contact sensor. The processing device may determine, using imaging data from the non-contact sensor, an orientation of a right-angled edge of the dot pattern. The processing device may determine, based on the orientation of the right-angled edge, whether a front surface of the transparent substrate is facing up or facing down. The processing (Continued)

device may also direct a robot to transfer the transparent substrate to a processing chamber dependent on whether the front surface of the transparent substrate is facing up or facing down.

20 Claims, 8 Drawing Sheets

(52) U.S. Cl.
CPC .. *H01L 21/67265* (2013.01); *H01L 21/67271* (2013.01); *H01L 21/67282* (2013.01); *H01L 21/67294* (2013.01); *H01L 21/68* (2013.01); *H01L 21/681* (2013.01)

(58) Field of Classification Search
CPC ......... H01L 21/67242; H01L 21/67265; H01L 21/67271; H01L 21/68
See application file for complete search history.

(56) References Cited

FOREIGN PATENT DOCUMENTS

| | | | |
|---|---|---|---|
| JP | 2005166841 | | 6/2005 |
| JP | 2005166841 A | * | 6/2005 |
| JP | 2014107379 | | 6/2014 |
| JP | 2014107379 A | * | 6/2014 |
| KR | 20080087217 A | * | 10/2008 |
| KR | 1020080087217 | | 10/2008 |

OTHER PUBLICATIONS

PCT Notification of Transmittal of The International Search Report and The Written Opinion Of The International Searching Authority for PCT Application No. PCT/US2021/030957, dated Aug. 25, 2021, 9 pages.

* cited by examiner

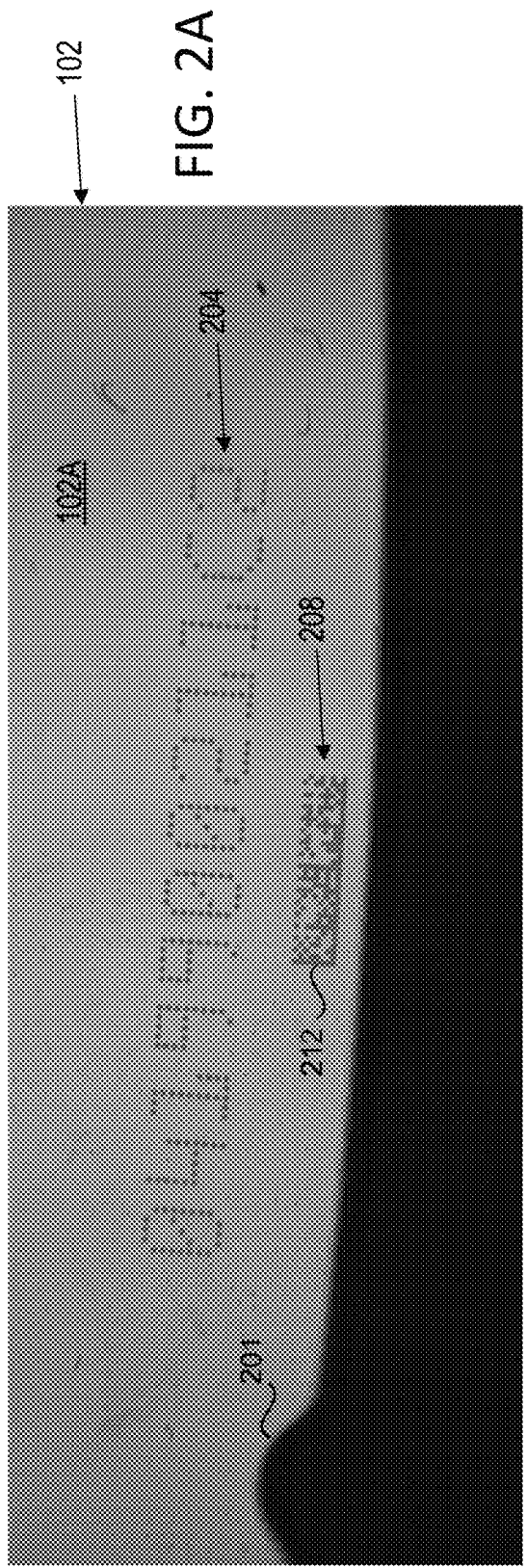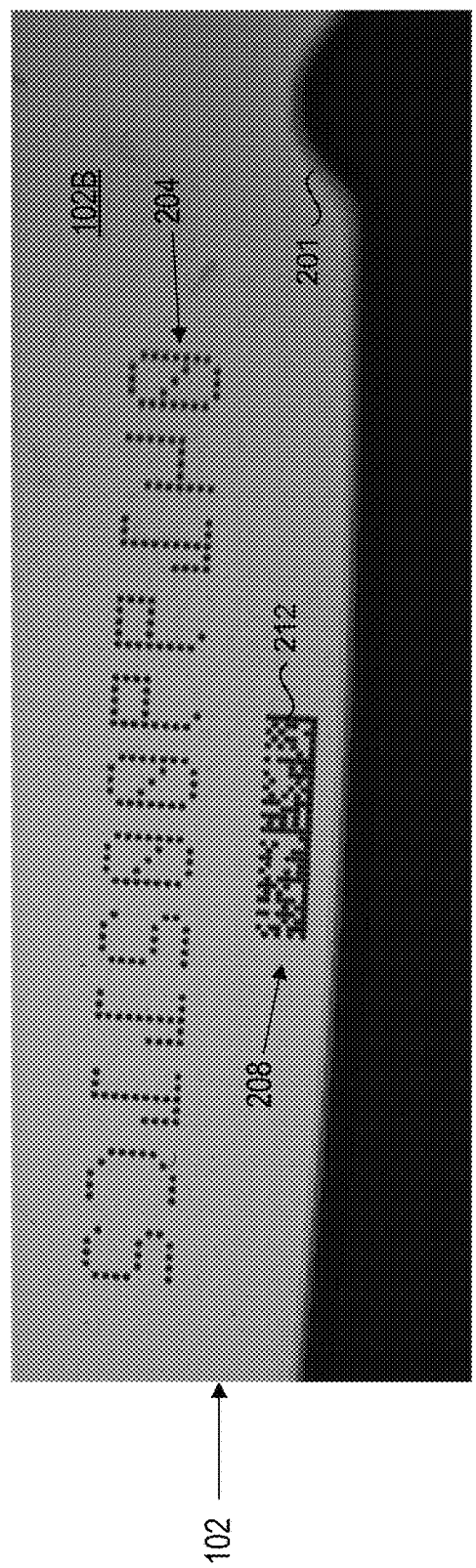

FRONT SURFACE AND BACK SURFACE ORIENTATION DETECTION OF TRANSPARENT SUBSTRATE

TECHNICAL FIELD

Embodiments of the present disclosure relate, in general, to methods and systems for handling transparent substrates in an electronics processing system, and in particular to front surface and back surface orientation detection of transparent substrates in an electronics processing system.

BACKGROUND

An electronics processing system may include one or more robot arms for transporting a substrate from a first station of the electronics processing system to a second station of the electronics processing system. In electronics processing systems, a substrate or an object is to be moved from the first station and placed at a target orientation and position at the second station. Use of transparent substrates (e.g., wafers) is relatively new in the processing industry. The fact that both front and back surfaces of transparent substrates may be processed (e.g., deposition, patterned etched, patterned metallization, and the like) means that knowing whether the front surface or the back surface of the transparent substrate is facing up matters. Processing the same surface of the transparent substrate with two different processes would render a transparent substrate defective and wastes material in the form of the raw transparent substrates.

SUMMARY

Some of the embodiments described cover a system (e.g., a processing system) that includes a substrate support on which to receive a transparent substrate. The system further includes a rotator attached to the substrate support, a laser detector pair to identify a fiducial in an edge of the transparent substrate, an optical character recognizer adapted to detect a dot pattern etched proximate to the fiducial on a surface of the transparent substrate, and a processing device coupled to the rotator, to the laser detector pair, and to the optical character recognizer. The processing device may be configured to direct the rotator to rotate the transparent substrate until the laser detector pair detects the fiducial. The processing device may further to direct the optical character recognizer to scan an area of the transparent substrate that is proximate to the fiducial until detecting the dot pattern at a location relative to the fiducial. The processing device may further to determine, based on the location, whether the front surface of the transparent substrate is facing up or facing down. The processing device may further to direct a robot to transfer the transparent substrate to a processing chamber dependent on whether the front surface of the transparent substrate is facing up or facing down.

In other embodiments, a system includes a substrate support on which to receive a transparent substrate, a non-contact sensor adapted to detect and image a dot pattern etched on a surface of the transparent substrate, and a processing device attached to the non-contact sensor. The processing device may be configured to determine, using imaging data from the non-contact sensor, an orientation of a right-angled edge of the dot pattern. The processing device may further determine, based on the orientation of the right-angled edge, whether a front surface of the transparent substrate is facing up or facing down. The processing device may further direct a robot to transfer the transparent substrate to a processing chamber dependent on whether the front surface of the transparent substrate is facing up or facing down.

In alternative or additional embodiments, a method of determining whether a transparent substrate is oriented up or down includes scanning, using a non-contact sensor of an aligner, a surface of a transparent substrate to locate SEMI standard characters etched into one of a top surface or a bottom surface of the transparent substrate. The method may further include attempting to read, using an optical character recognizer of the aligner, the SEMI standard characters. The method may further include determining, using a processing device coupled to the optical character recognizer, whether or not the SEMI standard characters are non-mirrored. The method may further include determining, using the processing device, whether the surface of the transparent substrate is a front surface of the transparent substrate depending on whether the SEMI standard characters are non-mirrored. The method may further include directing, using the processing device, a robot to transfer the transparent substrate to a processing chamber dependent on whether the front surface of the transparent substrate is facing up or facing down.

In some embodiments, a non-transitory computer readable medium comprises instructions that, when executed by a processing device, cause the processing device to perform the operations of any of the above discussed methods.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 2A-2B illustrate a front surface and a back surface, respectively, of a transparent substrate, according to aspects of the disclosure.

DETAILED DESCRIPTION OF EMBODIMENTS

Figure 1:
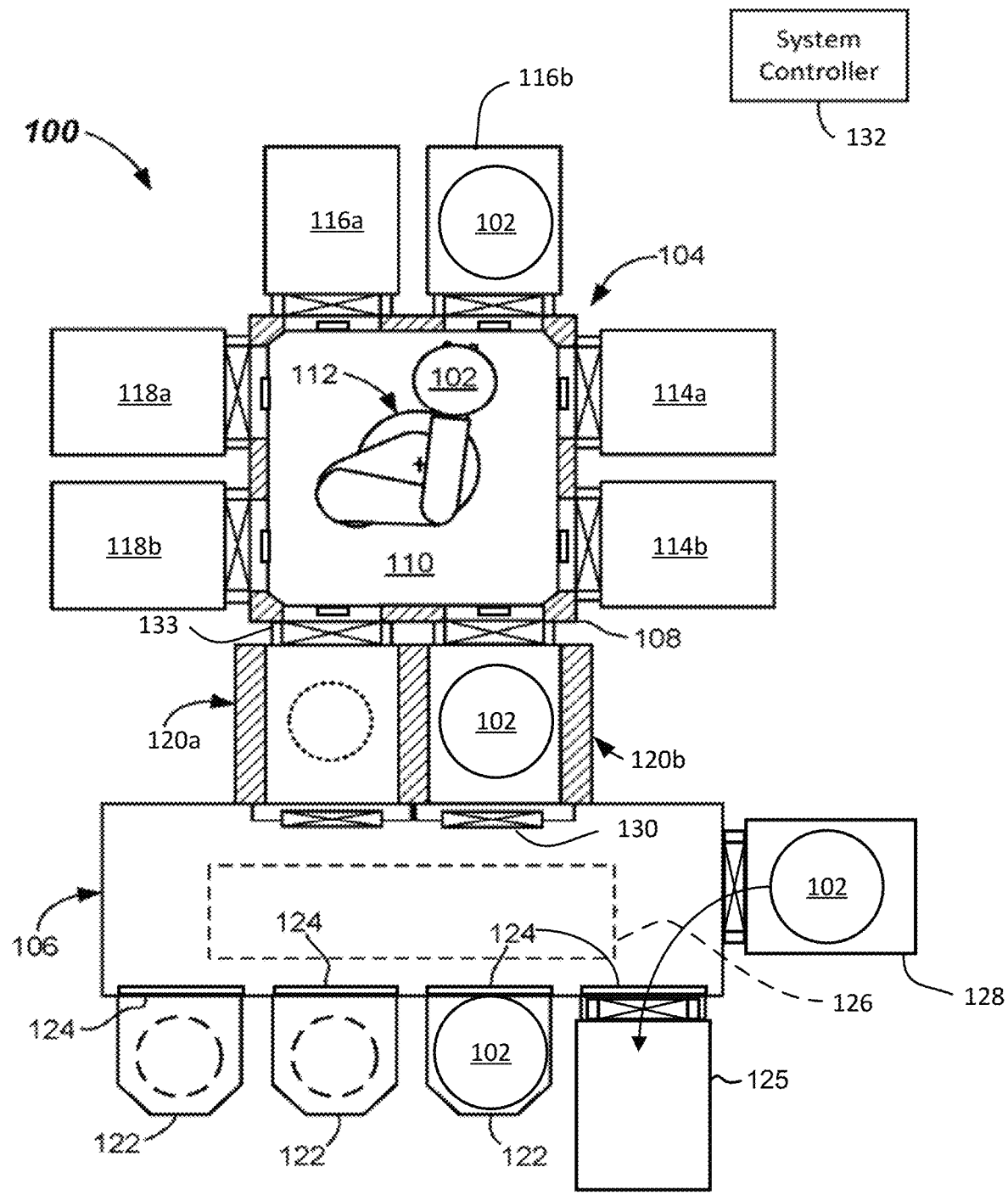
FIG. 1 is a top schematic view of an example electronic processing system, according to aspects of the disclosure.

Embodiments described herein are related to methods and systems for detecting front surface and back surface orientations of a transparent substrate. A transparent substrate may include a glass or plastic substrate or wafer, or substrate made of other transparent material. Current substrate processing systems are being adapted to mark, track, and process transparent substrates. These substrate processing systems may uniquely process, e.g., perform atomic layer deposition (ALD), plasma vapor deposition (PVD), chemical vapor deposition (CVD), etch, and the like, on both a front surface and a back surface of transparent substrates such as transparent wafers made of glass, plastic, and the like. Such transparent substrates may be employed in optics products such as virtual reality or augmented reality eyewear, medical wearables, and other products that employ planar waveguides, and other such optical-based electronics.

In various embodiments, transparent substrates may also be processed to create waveguide combiners (WGC) to form patterns or structures on the transparent substrates to modulate light received (as an in-coupler) and light transmitted (as an out-coupler) with respect to the eye. For alternate reality applications, these WGC structures can be achieved by forming surface gratings via direct etching of the transparent substrate surfaces to form these pattern and structures, or by putting down a film and imprinting the film with the desired pattern or structure. The shape, pitch, and height of the gratings along with the refractive index of the transparent substrate, may determine the quality of light transmitted measured in terms of clarity, color, fidelity, and the like. Another feature is the viewing angle through the transparent substrates, where wider viewing angles provide better transparency for WGC patterns and structures. Wider viewing angles may be achieved by steep gratings, double side gratings or very high index of refraction, which often requires double sided processing of the transparent substrates.

As discussed, the fact that both front and back surfaces of transparent substrates may be processed (e.g., deposition, patterned etched, patterned metallization, and the like) means that the processing system should determine whether the front surface or the back surface of the transparent substrate is facing up before processing. Processing the same surface of the transparent substrate with two different processes would render the transparent substrate defective. Accordingly, the processing system may be adapted with a substrate flipping station that may be directed by a system controller to flip select transparent substrates before sending the select transparent substrates onto a processing chamber for processing of the surface of the transparent substrate that is facing up.

Further, an aligner that is used to orient the transparent substrates before processing may be enhanced to include an optical character recognizer and/or a non-contact sensor to determine whether the transparent substrates have a front surface facing up or the front surface facing down. In one embodiment, the optical character recognizer can detect a dot pattern etched proximate to a fiducial (e.g., flat, a notch, a projection, or the like) on a surface of the transparent substrate. A processing device (e.g., of a system controller) may be coupled to the aligner and be able to direct a rotator of the aligner to rotate the transparent substrate until a laser detector pair detects the fiducial, and thus also a location of the fiducial. The processing device may also direct the optical character recognizer to scan an area of the transparent substrate that is proximate to the fiducial until detecting the dot pattern at a location relative to the fiducial. The processing device may determine, based on the location, whether the front surface of the transparent substrate is facing up or facing down, and then direct a robot to transfer the transparent substrate to a processing chamber dependent on whether the front surface is facing up or facing down. For example, the processing device may direct the robot to process the transparent substrate on a specific side, and/or direct the robot to send the transparent substrate to a flipping station to match a processing chamber recipe.

In another embodiment, the non-contact sensor may detect and image a dot pattern etched on a surface of the transparent substrate. The processing device may determine, using imaging data from the non-contact sensor, an orientation of a right-angled edge of the dot pattern. The processing may further determine, based on the orientation, whether a front surface of the transparent substrate is facing up or facing down. If the next step in a processing sequence requires the transparent substrate to be facing up and the transparent substrate is facing up, no further action is necessary. If however, the transparent substrate is facing down, and thus incorrectly oriented, the processing device can direct the robot to transfer the transparent substrate to a flipping state to flipped to the correct orientation before being sent to a processing chamber.

In a further embodiment, the non-contact sensor may instead scan a surface of the transparent substrate to locate SEMI standard characters etched into the transparent substrate. The SEMI standard is a specification for polished monocrystalline silicon wafers approved by the Global Silicon Wafer Committee. The optical character recognizer can then determine whether the SEMI standard characters are non-mirrored. If non-mirrored, the optical character recognizer can recognize (e.g., read) the SEMI standard characters and the transparent substrate is oriented with the front surface facing up. If the optical character recognizer cannot recognize (e.g., cannot read) the SEMI standard characters, or otherwise determines that they are mirrored, the transparent substrate is oriented with the front surface facing down. Other methods or ways of employing the optical character recognizer and/or non-contact sensor to verify the orientation of transparent substrate are disclosed in more detail below. These and other embodiments provide the advantage of seamlessly detecting the orientation (e.g., front surface facing up or facing down) of transparent substrate. Once orientation is known, the system controller (e.g., processing device) may be able to quickly, within the processing environment, know whether to transfer any particular transparent substrate to a flipping station to be flipped in orientation before sending the transparent substrate to a processing chamber for processing.

FIG. 1 is a top schematic view of an example electronics processing system 100, according to one aspect of the disclosure. Electronics processing system 100 may perform one or more processes on a transparent substrate 102. The electronics processing system 100 may include a mainframe 104 and a factory interface 106 coupled to mainframe 104. Mainframe 104 may include a housing 108 having a transfer chamber 110 therein. Transfer chamber 110 may include one or more processing chambers (also referred to as process chambers) 114a, 114b, 116a, 116b, 118a, 118b disposed therearound and coupled thereto. Processing chambers 114a, 114b, 116a, 116b, 118a, 118b may be coupled to transfer chamber 110 through respective ports 131, which may include slit valves or the like.

Note that an approximately square shaped mainframe having four sides (also referred to as facets) is shown, with multiple processing chambers connected to each facet. However, it should be understood that a facet may include a single processing chamber or more than two processing chambers coupled thereto. Additionally, the mainframe 104 may have other shapes, such as a rectangular shape (in which different facets may have different lengths) or a radial shape with more than four facets (e.g., with five, six, or more facets).

Processing chambers 114a, 114b, 116a, 116b, 118a, 118b may be adapted to carry out any number of processes on the transparent substrates 102. A same or different substrate process may take place in each processing chamber 114a, 114b, 116a, 116b, 118a, 118b. A substrate process may include ALD, PVD, CVD, etching, annealing, curing, pre-cleaning, metal or metal oxide removal, or the like. In one example, a PVD process may be performed in one or both of processing chambers 114a, 114b, an etching process may be performed in one or both of processing chambers 116a, 116b, and an annealing process may be performed in one or both of processing chambers 118a, 118b. Other processes may be carried out on transparent substrates therein. Processing chambers 114a, 114b, 116a, 116b, 118a, 118b may each include a substrate support assembly. The substrate support assembly may be configured to hold a transparent substrate in place while a substrate process is performed.

The transfer chamber 110 may also include a transfer chamber robot 112. Transfer chamber robot 112 may include one or multiple robot arms where each robot arm includes one or more end effectors (also referred to herein as blades) at the end of the robot arm. The end effector may be configured to handle particular objects, such as transparent substrates (wafers). Alternatively, or additionally, the end effector may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on.

One or more load locks 120a, 120b may also be coupled to housing 108 and transfer chamber 110. Load locks 120a, 120b may be configured to interface with, and be coupled to, transfer chamber 110 on one side and factory interface 106 on another side. Load locks 120a, 120b may have an environmentally-controlled atmosphere that may be changed from a vacuum environment (wherein substrates may be transferred to and from transfer chamber 110) to an at or near atmospheric-pressure (e.g., with inert-gas) environment (wherein substrates may be transferred to and from factory interface 106) in some embodiments. In some embodiments, one or more load locks 120a, 120b may be a stacked load lock having one or more upper interior chambers and one or more lower interior chambers that are located at different vertical levels (e.g., one above another). In some embodiments, a pair of upper interior chambers are configured to receive processed substrates from transfer chamber 110 for removal from mainframe 104, while a pair of lower interior chambers are configured to receive substrates from factory interface 106 for processing in mainframe 104. In some embodiments, one or more load locks 120a, 120b may be configured to perform a substrate process (e.g., an etch or a pre-clean) on one or more transparent substrates 102 received therein. In embodiments, ports 133 and/or slit valves separate the transfer chamber 110 from the load locks 120a, 120b.

Factory interface (FI) 106 may be any suitable enclosure, such as, e.g., an Equipment Front End Module (EFEM). Factory interface 106 may be configured to receive transparent substrates 102 from substrate carriers 122 (e.g., Front Opening Unified Pods (FOUPs)) docked at various load ports 124 of the FI 106. A factory interface robot 126 (shown dashed) may be configured to transfer transparent substrates 102 between substrate carriers 122 (also referred to as containers) and load lock 120. Factory interface robot 126 may include one or more robot arms and may be or include a SCARA robot. In some embodiments, factory interface robot 126 may have more links and/or more degrees of freedom than transfer chamber robot 112. Factory interface robot 126 may include an end effector on an end of each robot arm. The end effector may be configured to pick up and handle specific objects, such as wafers. Alternatively, or additionally, the end effector may be configured to handle objects such as process kit rings.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments. In some embodiments, a side storage pod (SSP, not shown) is coupled to the FI 106.

The substrate carriers 122 as well as load ports 124, substrate carriers 122, load locks 120a, 120b, SSPs, and processing chambers 114a, 114b, 116a, 116b, 118a, 118b are each considered to be or include stations herein. Another type of station is an aligner station 128, which may include an aligner (303 in FIG. 3). In some embodiments, a flipping station 125 is attached to the factory interface 106. Although illustrated positioned at one of the load ports 124, it should be understood that the flipping station 125 may be located at any of the load ports 124 (e.g., in lieu of one of the substrate carriers 122) or positioned as a replacement to any of the processing chambers 114a, 114b, 116a, 116b, 118a, or 118b of the mainframe 104. The flipping station 125 may receive a transparent substrate 102 from the aligner station 128, as directed by a system controller 132, in order to flip the transparent substrate to match a processing chamber recipe or flip an incorrectly oriented transparent substrate before further processing by one or more processing chambers. In a related embodiment, the mainframe 104 does not exist and the factory interface robot 126 may transport the correctly oriented transparent substrates to processing chambers (or modules) coupled directly to the factory interface 106. In an alternative embodiment, the aligner station 128 and the flipping station 125 are coupled to the mainframe 104, and the factory interface 106 may or may not be present. The flipping station 125 may thus operate at atmospheric pressure, particularly if coupled to an atmospheric FI, or operate at vacuum, particularly if coupled to the mainframe 104.

In some embodiments, transfer chamber 110, processing chambers 114a, 114b, 116a, 116b, and 118a, 118b, and load lock 120 may be maintained at a vacuum level. Electronics processing system 100 may include one or more ports 130, 131, 133 (e.g., vacuum ports) that are coupled to one or more stations of electronics processing system 100. For example, ports 130 (e.g., vacuum ports) may couple factory interface 106 to load locks 120. Additional ports 133 (e.g., vacuum ports) may be coupled to load locks 120 and disposed between load locks 120 and transfer chamber 110, as discussed above. Each of the ports 130, 133, 131 may include slit valves that separate a vacuum environment from a higher pressure (e.g., atmospheric pressure) environment.

In some embodiments, the aligner station 128 is coupled to the FI 106. Alternatively, the aligner station 128 may be housed in FI 106. A port separates the aligner station 128 from the FI 106 in some embodiments. The aligner station 128 is configured to align transparent substrates 102, fixtures, and/or other objects (e.g., process kit rings) to a target orientation. The aligner station 128 may include an aligner and associated components as discussed with reference to FIG. 3.

Electronics processing system 100 may also include the system controller 132. System controller 132 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 132 may include a data storage device (e.g., one or more disk drives and/or solid state drives), a main memory, a static memory, a network interface, and/or other components. System controller 132 may execute instructions to perform any one or more of the methodologies and/or embodiments described herein. The instructions may be stored on a computer readable storage medium, which may include the main memory, static memory, secondary storage and/or processing device (during execution of the instructions). System controller 132 may also be configured to permit entry and display of data, operating commands, and the like by a human operator.

FIGS. 2A-2B illustrate a front surface 102A and a back surface 102B, respectively, of a transparent substrate 102, according to aspects of the disclosure. In various embodiments, the transparent substrate 102 includes a fiducial 201, which as mentioned, may be a flat, a notch, a projection, or the like. For purposes of explanation, the fiducial 201 illustrated in FIGS. 2A-2B is a notch. The transparent substrate 102 may further include various distinct dot patterns, which in some embodiments, include SEMI standard characters 204 and a two-dimensional SEMI T7 mark 208. Other dot patterns, marks, or indicators are envisioned that may be employed. These dot patterns may be generally expected to be etched into the back surface 102B of the transparent substrate 102, as illustrated in FIG. 2B, but may be etched on the front surface 102A and still provide a guide for orientation determination because the transparent substrate 102 is see-through.

As illustrated in FIG. 2A, the dot pattern(s) are still visible through the front surface 102A of the transparent substrate. For example, the SEMI standard characters 204 and are etched so as to be readable through the front surface 102A of the transparent substrate 102. Because the SEMI standard characters 204 are oriented as a mirrored image from the back surface 102B of the transparent substrate 102, the SEMI standard characters 204 may not be readable from the back surface 102B perspective. The SEMI T7 mark 208 is a standard mark etched in substrates and which has a right-angled edge 212 of a dot pattern. The orientation of the right-angled edger 212 of the dot pattern is detectable from either the front surface or the back surface of the transparent substrate 102.

Figure 2C:
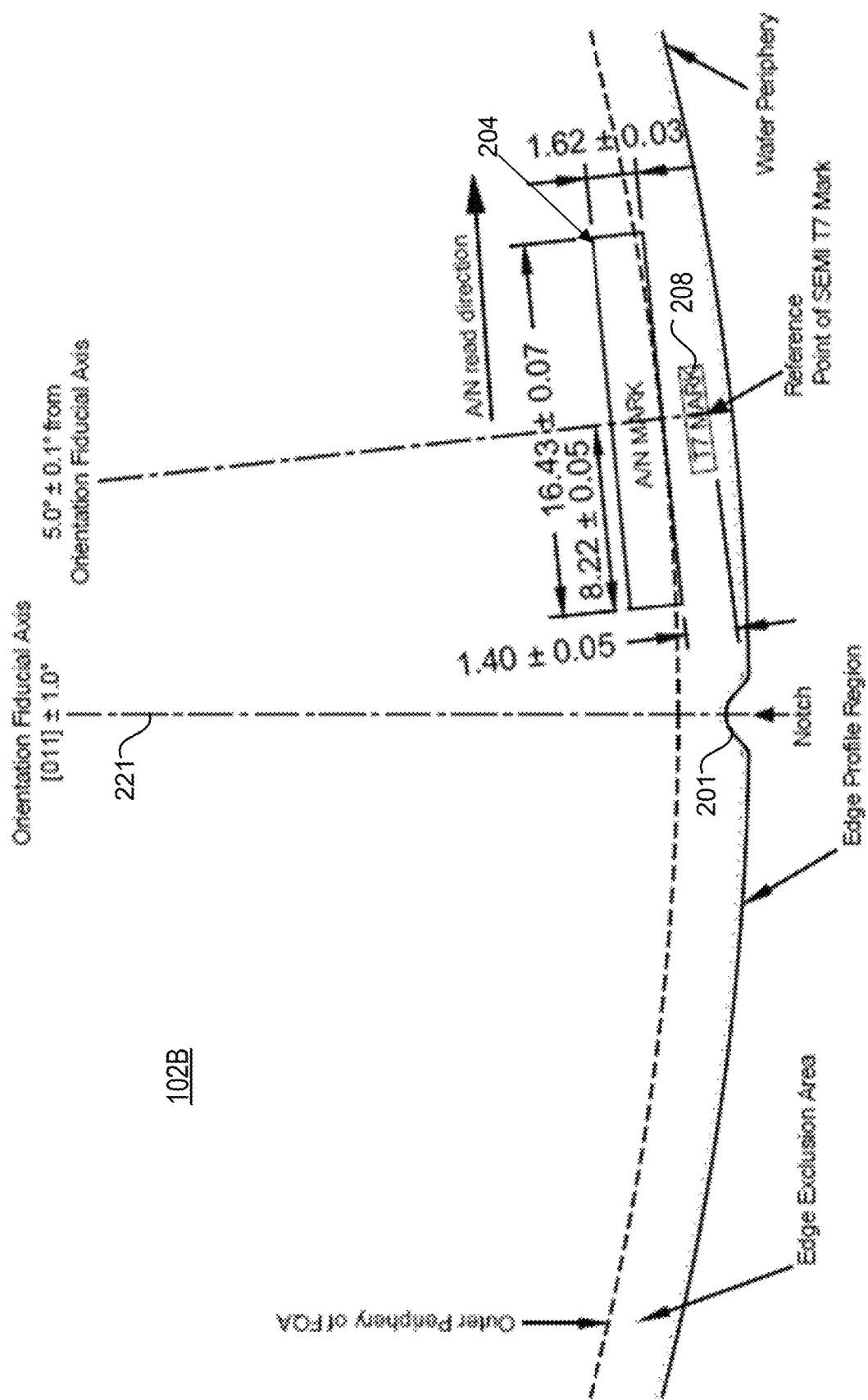
FIG. 2C illustrates dimensions with reference to dot patterns and a fiducial axis of the transparent substrate of FIGS. 2A-2B, according to aspects of the disclosure.

FIG. 2C illustrates dimensions with reference to dot patterns and a fiducial axis of the transparent substrate of FIGS. 2A-2B, according to aspects of the disclosure. In various embodiments, the SEMI standard characters 204 (e.g., A/N Mark) may be etched into the back surface 102B of the transparent substrate with the illustrated SEMI-standard based dimensions and tolerances. Similarly, the SEMI T7 mark 208 is illustrated etched into the fixed quality area (FQA) next to a periphery of the back surface 102B of the transparent substrate 102 with the illustrated dimensions and tolerances. All dimensions are illustrated in millimeters (mm).

In various embodiments, once the fiducial 201 (e.g., notch) is located, the aligner may determine a location and orientation of a fiducial axis 221. The aligner may then locate, at a right side of the fiducial 201, either the SEMI standard characters 204 or the SEMI T7 mark 208 at a five degrees (plus or minus 0.1 degree) angle from the fiducial axis 221. This angle may be at a clockwise direction from the fiducial axis 221. More generally, including outer limits of the SEMI standard characters 204 or the SEMI T7 mark 208, these dot patterns may be detected within three and eight degrees relative to the fiducial axis 221 of the fiducial 201. Further, if the transparent substrate 102 is flipped with the front surface 102A facing down, then, as illustrated in FIG. 2B, the aligner may locate the SEMI standard characters 204 or the SEMI T7 mark 208 at a negative five degrees (plus or minus 0.1 degrees) at the left of the fiducial. This angle may be at a counterclockwise direction from the fiducial axis 221. More generally, including outer limits of the SEMI standard characters 204 or the SEMI T7 mark 208, these dot patterns may be detected within three and eight degrees relative to the fiducial axis 221 of the fiducial 201.

Figure 3:
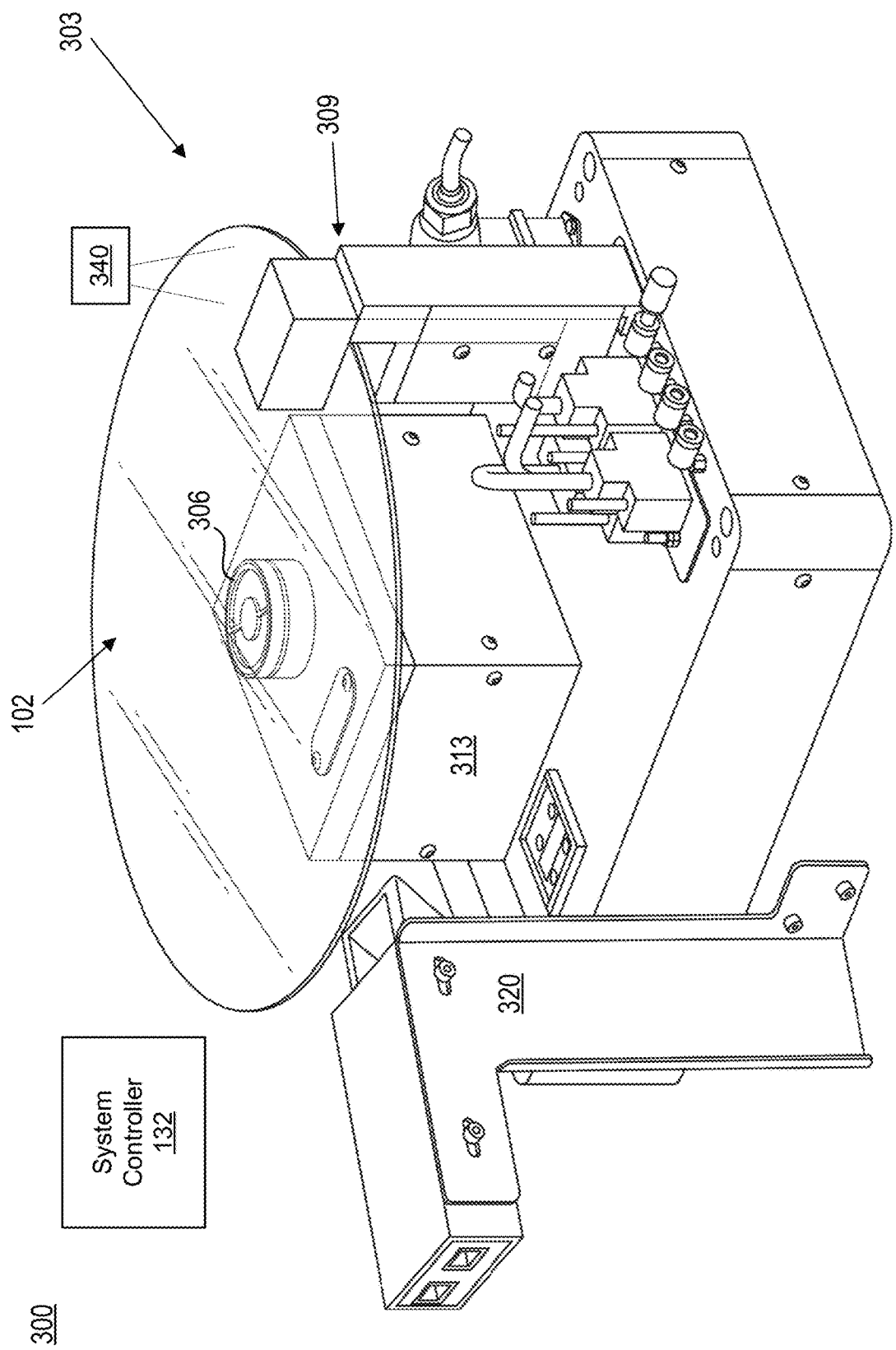
FIG. 3 is an aligner and associated system for detecting a front surface or back surface orientation of a transparent substrate, according to aspects of the disclosure.

FIG. 3 is an aligner and associated system 300 for detecting a front surface or back surface orientation of a transparent substrate 102, according to aspects of the disclosure. In various embodiments, the system 300 includes the system controller 132 and an aligner 303, which may include or be associated with an optical character recognizer 320 and a non-contact sensor 340. While the optical character recognizer 320 is a component that scans particularly to recognize and read text, the non-contact sensor 340 may be a camera (e.g., a high resolution depth camera), a depth sensor, an image scanner or the like that may detect and image text, dot patterns, and other images etched or printed on the surface of the transparent substrate 102. In some embodiments, the non-contact sensor 340 is an optical sensor that detects interruption of a light source reflecting off irregularities in the surface of the transparent substrate 102, including the dot pattern(s) discussed herein.

The aligner 303 may further include, among other components, a substrate support 306 onto which the transparent substrate 102 is placed, a laser detector pair 309 (e.g., laser and detector), and a rotator 313. In one embodiment, the non-contact sensor 340 is, or is combined into, the laser detector pair 309. The system controller 132 may store light reflection patterns consistent with the fiducial 201 and other dot patterns (or etched patterns) expected to be recognized. By way of comparison with these stored light reflection patterns, the system controller 132 may employ the non-contact sensor 340 and/or the laser detector pair 309 to detect and differentiate between the fiducial 201, the SEMI standard characters 204, the SEMI T7 mark 208, or other similar etched patterns. Once the transparent substrate 102 is placed on the substrate support 306, the substrate support 306 and transparent substrate 102 placed thereon are rotated, and an initial orientation on the aligner station 128 and a target orientation on the aligner station 128 may be detected based on such orientation.

In one embodiment, the aligner 303 includes one or more pairs of lasers and detectors (e.g., a line of laser and detector pairs), although just the laser detector pair 309 is illustrated for simplicity. The laser(s) may each project a laser beam that is vertical or at an angle to vertical. Each detector may be in a path of a laser beam, and detects the laser beam when the laser beam is received by the detector. As the supported transparent substrate is rotated, one or more of the laser beams is interrupted by the transparent substrate 102 such that it is not received by a detector for each rotation setting. This interruption may be to refract or curve the laser beam, which still at least partially traverses the transparent substrate 102. This information may be used to determine a distance between an edge of the transparent substrate 102 at a particular location that interrupted the one or more laser beams and a center of the aligner 303 for each rotation setting of the aligner 303. The aligner 303 may then detect the fiducial 201 in response to the detector detecting unimpeded light from the laser, e.g., light that does not refract or bend in another direction. A known shape of the fiducial 201 may then be used to detect the distance between the edge of the transparent wafer 102 and the center of the aligner 303 (and thus also may detect the center of the aligner station 128). Knowing the location of the fiducial 201 may also be used to detect a location of the dot patterns, mark, or other indicia discussed with reference to FIGS. 2A-2C.

More specifically, the center of the aligner 303 may be determined for each rotation setting, and a known shape of the fiducial 201 may be used to identify the fiducial in the transparent substrate from the determined distances. Once the rotation setting associated with the fiducial location is identified, the phase of the transparent substrate 102 can be determined. This information can be used to determine a target orientation of the transparent substrate 102 as well as an initial orientation that the transparent substrate had when it was placed on the aligner 303 at the aligner station 128. Additionally, the aligner 303 may detect runout of the transparent substrate placed off center from a center of the aligner 303 based on the detected phase of the transparent substrate and the distances between the edge of the transparent substrate and the center of the aligner 303 for each rotation setting. Other detection mechanisms may also be used to detect orientation and/or runout of transparent substrate 102 at the aligner station 128.

In various embodiments, the system controller 132 (e.g., processing device) may be coupled to the aligner 303 of the aligner station 128. The system controller 132 may direct the non-contact sensor 340 or the optical character recognizer 320 to scan an area of the transparent substrate 102 that is proximate to the fiducial 201 until detecting the dot pattern (or mark or other indicia). Particular examples of the dot pattern include the SEMI standard characters 204 or the SEMI T7 mark 208.

If the optical character recognizer 320 fails to locate the dot pattern, the system controller 132 may direct the aligner 303 to rotate the transparent substrate 102 by plus or minus five degrees, and then retry the scan (e.g., "hunt") to locate the dot pattern. In some embodiments, the non-contact sensor 340 may be located at a distance from the center of the transparent substrate to generally be able to scan an area where the dot pattern should be relative to the center and notify the system controller 132 upon finding the location of dot pattern.

The system controller 132 can further determine, based on the location of the dot pattern, whether the front surface 102A of the transparent substrate is facing up or facing down. The system controller 132 may direct a robot (e.g., factory interface robot 126) to transfer the transparent substrate 102 to one of the processing chambers 114a, 114b, 116a, 116b, 118a, 118b dependent on whether the front surface 102A of the transparent substrate 102 is facing up or facing down.

In one embodiment, to detect the dot pattern (e.g., SEMI T7 mark 208), the optical character recognizer 320 may detect that the dot pattern is located to a first side of the fiducial 201, and thus the transparent substrate 102 is facing up. The first side may be the right side, as illustrated in FIG. 2A, e.g., the location of the dot pattern may be between three and eight degrees relative to the fiducial axis 221 of the fiducial 201. Otherwise, the optical character recognizer 320 detects the dot pattern (e.g., SEMI T7 mark 208) located to a second side of the fiducial 201 (e.g., that is opposite to the first side), and thus the transparent substrate 102 if facing down. The second side may be the left side, as illustrated in FIG. 2B, e.g., between negative three and negative eight degrees relative to the fiducial axis 221 of the fiducial 201.

In a further embodiment, e.g., without necessarily having access to any fiducial on the transparent substrate 102, if the optical character recognizer 320 can read the SEMI standard characters 204, then the optical character recognizer 320 can indicate as much to the system controller 132, which may thus determine that the front surface 102A of the transparent substrate 102 is facing up as in FIG. 2A. In contrast, if the optical character recognizer 320 cannot read the SEMI standard characters 204, then the optical character recognizer 320 can indicate as much to the system controller 132, which may thus determine that the back surface 201B is facing up as in FIG. 2B. In this way, the system controller 132, in being coupled to the optical character recognizer 320, may determine the orientation of the transparent substrate 102.

In an additional or alternative embodiment, the system controller 132 can use the non-contact sensor 340 to detect and image the dot pattern from a surface of the transparent substrate 102, whether the front surface 102A or the back surface 102B. Thus, this embodiment may also not necessarily have to detect the location of the fiducial 201, although in some embodiments the system controller 132 does use information from the laser detect pair 309 to determine a fiducial to help narrow in on a search area for the non-contact sensor 340. The system controller 132 may use imaging data from the non-contact sensor 340 to determine the orientation of the right-angled edge 212 of the dot pattern, e.g., of the SEMI T7 mark 208. The system controller 132 may then determine, based on the orientation of the right-angled edge, whether a front surface of the transparent substrate 102 is facing up or facing down. For example, if the right-angled edge 212 is at a left of the dot pattern, the system controller 132 may conclude that the front surface 102A of the transparent substrate 102 is facing up as in FIG. 2A. Otherwise, if the right-angled edge 212 is at a right of the dot pattern, the system controller 132 may conclude that the front surface 102A is facing down as in FIG. 2B.

In various embodiments, the system controller 132 may execute software or other code in order to tune or train the optical character recognizer 320 or the non-contact sensor 340 to recognize the dot pattern (or other mark or indicia) and to determine which kind of dot pattern is recognized, e.g., to facilitate choosing one of the orientation determination approaches discussed herein. The tuning and training may be specific to different transparent substrates, e.g., manufactured by different vendors, and may be based on how lighting may refract differently for different thickness of the transparent substrate 102. Different trained software may be labeled differently and selected for execution depending on the type of transparent substrate. After execution of a particular software code for the specific transparent substrate 102 that locates and analyzes the dot pattern, the system controller 132 may output logs and events (e.g., output data), to include process sequences. These process sequences may include whether to send the transparent substrate 102 to the flipping station 128 or to a processing chamber to proceed with processing the surface that is facing up.

In some embodiments, the system controller 132, by virtue of information from the aligner 303 (e.g., the optical character recognizer 320 or the non-contact sensor 340), detects that the transparent substrate 102 is incorrectly flipped on the substrate support 306. In such a case, the system controller 132 may direct the robot to first transfer the transparent substrate 102 to a flipping station before being sent to the processing chamber. More particularly, the system controller 132 may determine an orientation of the transparent substrate 102 based on whether the front surface 102A of the transparent substrate 102 is facing up. The system controller 132 may further access event output data associated with the orientation of the transparent substrate 102 and also a process sequence for the transparent substrate 102 based on information listed in the event output data. This processing may coordinate next process steps with the orientation, and decide whether to send the transparent substrate 102 on to one of the processing chambers due to the orientation being correct, or to send the transparent substrate 102 to the flipping station due to the orientation being wrong. In one embodiment, the flipping station may be positioned within any one of the FI 106, the load lock 120a, 120b, or one of the processing chambers, e.g., processing chamber 114b or 118b.

With additional reference to FIG. 1, according to one aspect of the disclosure, an object such as the transparent substrate 102 is removed from a substrate carrier 122 (e.g., a FOUP) or SSP via factory interface robot 126 located in the factory interface 106, or alternatively, is loaded directly into the factory interface 106. In some embodiments, the system controller 132 determines a transfer recipe for the transparent substrate. The transfer recipe may indicate a transfer path that the transparent substrate 102 is to follow while being transported from substrate carrier 122 or SSP to a particular processing chamber 114a, 114b, 116a, 116b, 118a, 118b. For example, the transfer recipe may indicate that the transparent wafer 102 is to be moved from aligner station 128 to a particular load lock 120a, 120b to processing chamber 116a, 116b.

As discussed above, the aligner station 128 is configured to align an object such as the transparent substrate 102 to achieve a target orientation of thereof at a destination station (e.g., at a processing chamber 114a, 114b, 116a, 116b, or 118a, 118b). The aligner 303 of the aligner station 128 may rotate the object (e.g., transparent substrate 102) in a positive or negative yaw-axis direction (e.g., clockwise or counter-clockwise) to achieve an initial target orientation of the transparent substrate 102 at aligner station 128. In some embodiments, the aligner 303 may additionally or alternatively translate the transparent substrate 102 in a positive or negative x-axis and/or y-axis direction to align the transparent substrate at aligner station 128. In some embodiments, an x-direction offset and/or a y-direction offset of the object may be determined, and the offset(s) may be used to pick up the object such that a center of the object corresponds to a center of a pocket in a blade of the robot arm of the factory interface robot 126.

The initial target orientation of the transparent substrate 102 at aligner station 128 may nominally correspond with a target orientation of the transparent substrate 102 at a destination station, e.g., at processing chamber 114a, 114b, 116a, 116b, or 118a, 118b. The target orientation may be based on the fiducial 201 as discussed herein.

Figure 4:
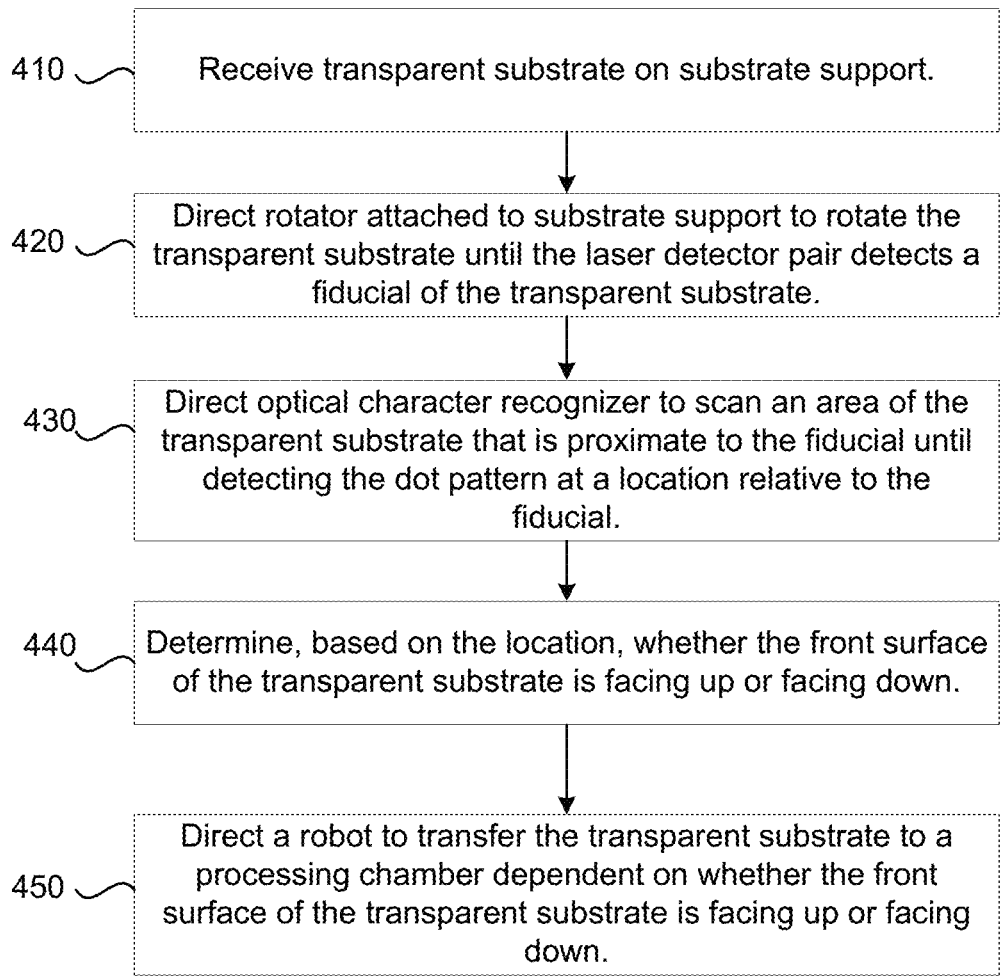
FIG. 4 is a flow chart of a method for detecting the orientation of a transparent substrate using an optical character recognizer with reference to a fiducial of the transparent substrate, according to aspects of the disclosure.

FIG. 4 is a flow chart of a method 400 for detecting the orientation of a transparent substrate using the optical character recognizer 320 with reference to the fiducial 201 of the transparent substrate 102, according to aspects of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the system controller 132 (FIGS. 1, 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the aligner 303 receives a transparent substrate 102 onto the substrate support 306. At operation 420, the processing logic directs the rotator 313 to rotate the transparent substrate 102 until the laser detector pair 309 detects the fiducial 201. The fiducial 201 may be a flat, a notch, a projection, or the like.

At operation 430, the processing logic directs the optical character recognizer 320 to scan an area of the transparent substrate 102 that is proximate to the fiducial 201 until detecting the dot pattern at a location relative to the fiducial 201. The dot pattern may be on either side of the fiducial axis 221, and thus the processing logic may direct the optical character recognizer 320 to search (e.g., "hunt") on one side of the fiducial axis 221 first and then, if not locating the dot pattern, search on the other side of the fiducial axis 221. The dot pattern may be one of any number of various distinct dot patterns, which in some embodiments, include the SEMI standard characters 204 or the two-dimensional SEMI T7 mark 208. Other dot patterns, marks, or indicators are envisioned that may be employed.

At operation 440, the processing logic determines, based on the location, whether the front surface 201A of the transparent substrate 102 is facing up or facing down. For example, if the dot pattern is located to the right of the fiducial 201 as in FIG. 2A, the processing logic may determine that the front surface 201A is facing up. In contrast, if the dot pattern is located to the left of the fiducial as in FIG. 2B, the processing logic may determine that the front surface is 201A is facing down, e.g., the back surface 201B is instead facing up.

At operation 450, the processing logic directs a robot (e.g., the factory interface robot 126) to transfer the transparent substrate 102 to a processing chamber dependent on whether the front surface 201A of the transparent substrate 102 is facing up or facing down. If the next step in the process sequence is to be performed on the surface of the transparent substrate 102 that is facing up, the processing logic may direct the robot to transfer the transparent substrate 102 to the processing chamber. Otherwise, the processing logic determines that the wrong surface is facing up, and directs to the robot to transfer the transparent substrate 102 to the flipping station 125 to be first be flipped. The robot may also transfer the transparent substrate 102 to the flipping station 125 to be flipped to match a processing chamber recipe.

Figure 5:
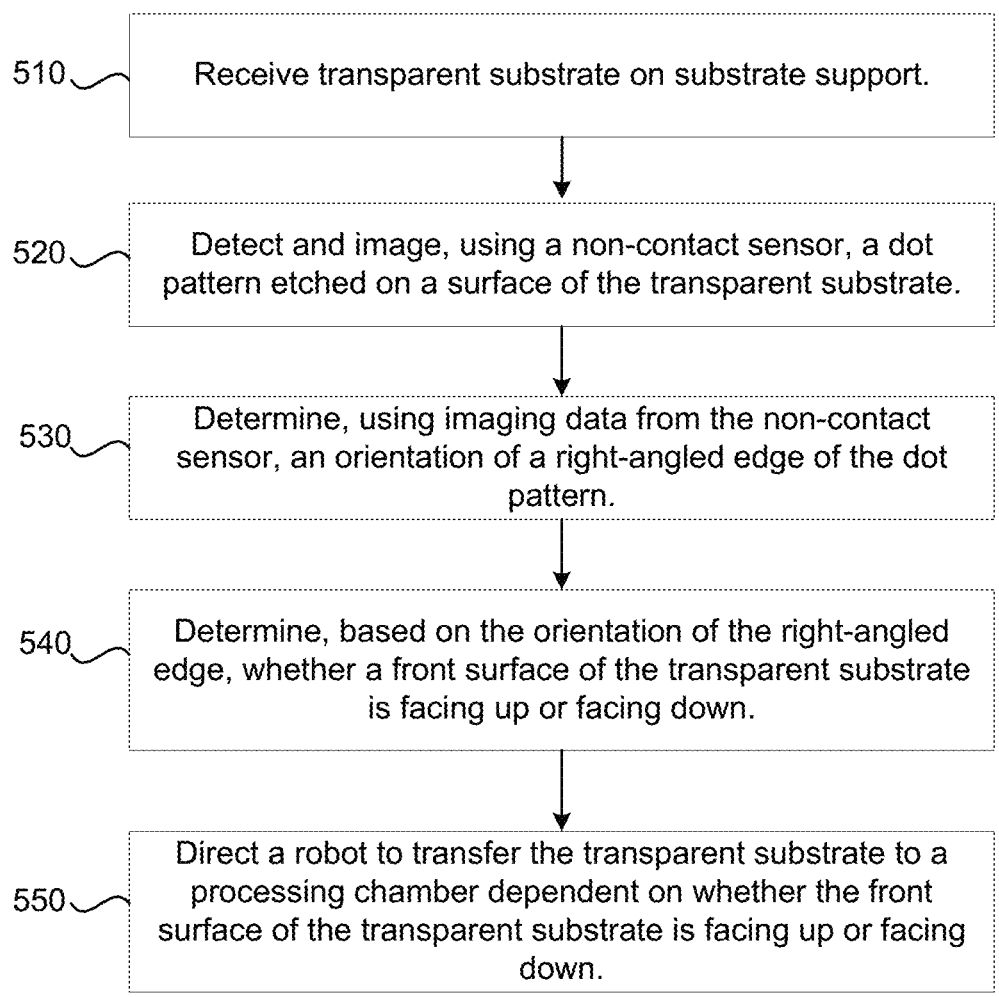
FIG. 5 is a flow chart of a method for detecting the orientation of a transparent substrate using a non-contact sensor with reference to a dot pattern of the transparent substrate, according to aspects of the disclosure.

FIG. 5 is a flow chart of a method 500 for detecting the orientation of a transparent substrate using the non-contact sensor 340 with reference to a dot pattern of the transparent substrate 102, according to aspects of the disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the system controller 132 (FIGS. 1, 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the aligner 303 receives a transparent substrate 102 onto the substrate support 306. At operation 520, the processing logic directs the processing logic to detect and image a dot pattern etched on a surface of the transparent substrate 102. The dot pattern may be one of any number of various distinct dot patterns, which in some embodiments, include the two-dimensional SEMI T7 mark 208. Other dot patterns, marks, or indicators are envisioned that may be employed that include a right-angled edge.

At operation 530, the processing logic determines, using imaging data from the non-contact sensor 340, an orientation of a right-angled edge 212 of the dot pattern. For example, the right-angled edge 212 may be oriented at a right or a left of the dot pattern.

At operation 540, the processing logic determines, based on the orientation of the right-angled edge 212, whether a front surface of the transparent substrate is facing up or facing down. For example, the processing logic may determine that the front surface 102A of the transparent substrate 102 is facing up by determining that the orientation of the right-angled edge 212 is at a left of the dot pattern. Further, the processing logic may determine that the front surface 102A of the transparent substrate is facing down by determining that the orientation of the right-angled edge 212 is at the right of the dot pattern.

At operation 550, the processing logic directs a robot to transfer the transparent substrate to a processing chamber dependent on whether the front surface of the transparent substrate is facing up or facing down. If the next step in the process sequence is to be performed on the surface of the transparent substrate 102 that is facing up, the processing logic may direct the robot to transfer the transparent substrate 102 to the processing chamber. Otherwise, the processing logic determines that the wrong surface is facing up, and directs to the robot to transfer the transparent substrate 102 to the flipping station 125 to be first be flipped. The robot may also transfer the transparent substrate 102 to the flipping station 125 to be flipped to match a processing chamber recipe.

Figure 6:
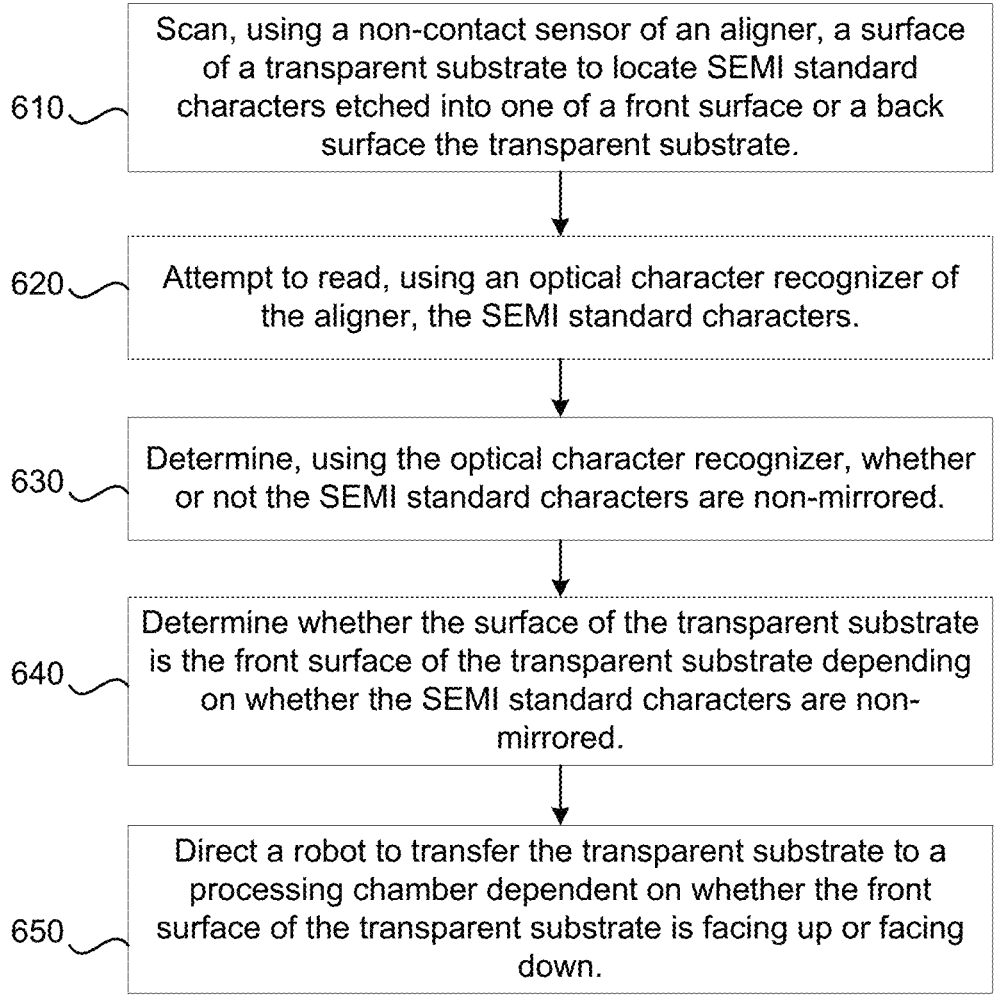
FIG. 6 is a flow chart of a method for detecting an orientation of a transparent substrate using an aligner and optical character recognizer, according to aspects of the disclosure.

FIG. 6 is a flow chart of a method 600 for detecting an orientation of a transparent substrate using an aligner and optical character recognizer, according to aspects of the disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the aligner 303 and the system controller 132 (FIGS. 1, 3). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic scans, using the non-contact sensor 340 of an aligner 303, a surface of a transparent substrate 102 to locate the SEMI standard characters 204 etched into one of the front surface 102A or the back surface 102B of the transparent substrate 102. Other dot patterns or characters may also be employed.

At operation 620, the processing logic attempts to read, using the optical character recognizer 320 of the aligner 303, the SEMI standard characters 204. The attempt to read the SEMI standard characters 204 may be made at either surface of the transparent substrate 102 because the transparent substrate 102 is see-through. So, while the non-contact sensor 340 can locate the SEMI standard characters 204, e.g., by scanning along a fixed range of distance from the center of the transparent substrate 102 (see FIG. 3), the optical character recognizer 320 may attempt to read the SEMI standard characters 204 once located.

At operation 630, the processing logic determines, using the optical character recognizer 320, whether or not the SEMI standard characters 204 are non-mirrored, e.g., by way of the results of the attempt to read the SEMI standard characters. One indication that the SEMI standard characters 204 are non-mirrored is that the optical character recognizer 320 may quickly read the SEMI standard characters 204 without having to perform processing that flips the image for subsequent character recognition. At operation 640, the processing logic determines whether the surface of the transparent substrate 102 is the front surface 102A of the transparent substrate 102 depending on whether the SEMI standard characters 204 are non-mirrored (or known to be mirrored). For example, if the optical character recognizer 320 responds with an error or null response based on the read attempt of the SEMI standard characters 204 (or other characters or text), then the SEMI standard characters 204 may be mirrored and the front surface 102A of the substrate 102 is facing down. If, however, the optical character recognizer 320 responds with read text from the SEMI standard characters 204, the processing logic determines that the front surface 201A of the transparent substrate 102 is oriented facing up.

In an additional, or alternative, embodiment to operations 630-640, the optical character recognizer 320 is adapted to read mirrored ones of the SEMI standard characters (e.g., after flip-image processing) and determine that the characters are mirrored. If mirrored, the processing logic determines that the surface of the transparent substrate is the back surface.

At operation 650, the processing logic directs a robot (e.g., the factory interface robot 126) to transfer the transparent substrate 102 to a processing chamber dependent on whether the front surface 201A of the transparent substrate 102 is facing up or facing down. If the next step in the process sequence is to be performed on the surface of the transparent substrate 102 that is facing up, the processing logic may direct the robot to transfer the transparent substrate 102 to the processing chamber. Otherwise, the processing logic determines that the wrong surface is facing up, and directs to the robot to transfer the transparent substrate 102 to the flipping station 125 to be first be flipped. The robot may also transfer the transparent substrate 102 to the flipping station 125 to be flipped to match a processing chamber recipe.

Figure 7:
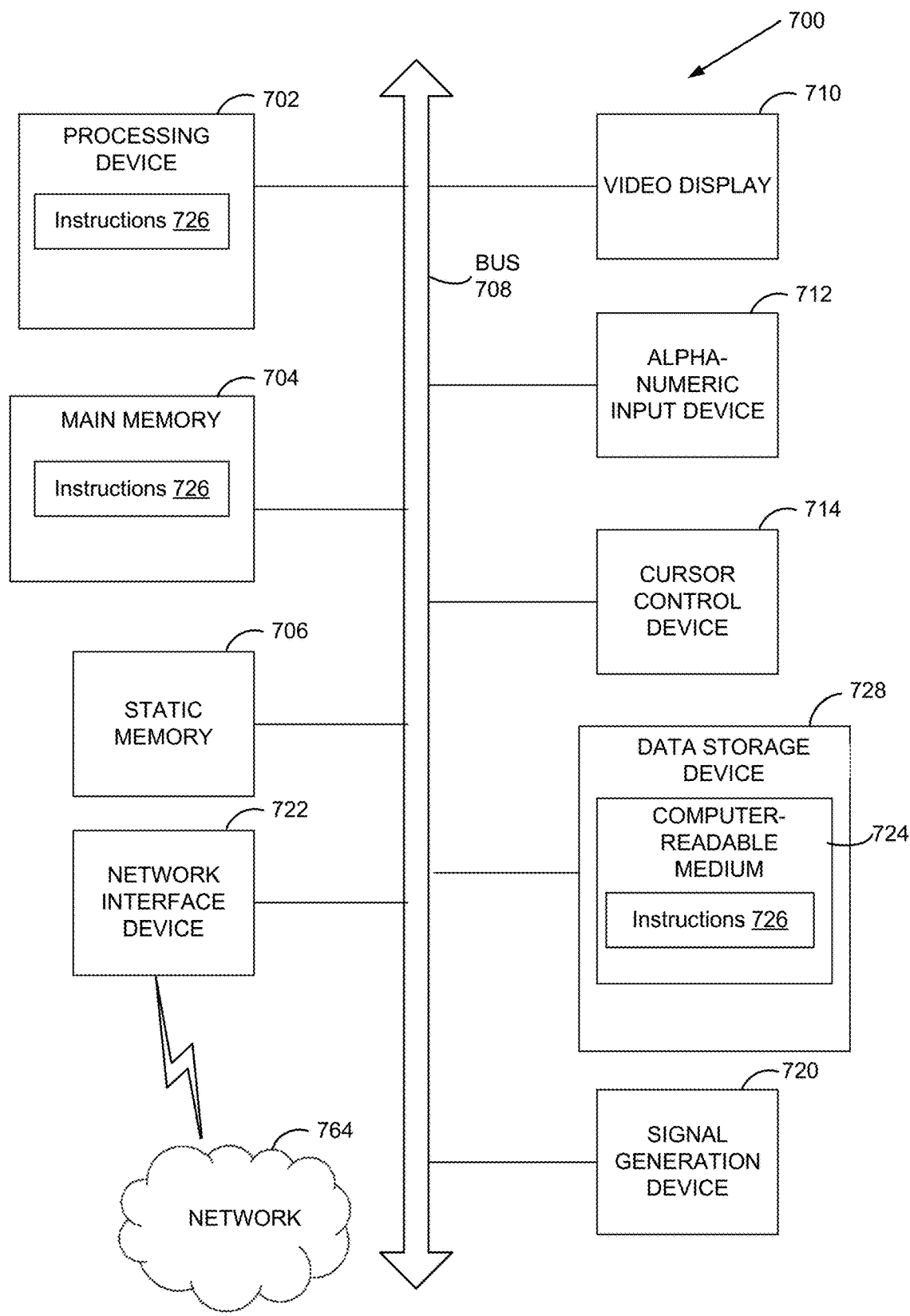
FIG. 7 is an example computing device that may operate as a system controller for an electronics processing system, in accordance with embodiments of the present disclosure.

FIG. 7 is an example computing device 700 that may operate as a system controller (e.g., the system controller 132) for an electronics processing system, in accordance with embodiments of the present disclosure. The computing device 700 is a machine within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In an embodiment, computing device 700 corresponds to system controller 132 of FIG. 1. In one embodiment, system controller 132 is a component of computing device 700.

The example computing device 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory (e.g., a data storage device 712), which communicate with each other via a bus 708.

Processing device 702 represents one or more general-purpose processors such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. Processing device 702 is configured to execute the processing logic (instructions 722) for performing the operations discussed herein. In one embodiment, system controller 132 corresponds to processing device 702. In embodiments, processing device 702 executes instructions 726 to implement any of methods 400-700 in embodiments.

The computing device 700 may further include a network interface device 722. The computing device 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a machine-readable storage medium (or more specifically a computer-readable storage medium) 728 on which is stored one or more sets of instructions 722 embodying any one or more of the methodologies or functions described herein. The instructions 722 may also reside, completely or at least partially, within the main memory 704 and/or within the processing device 702 during execution thereof by the computer system 700, the main memory 704 and the processing device 702 also constituting computer-readable storage media. The data storage device 718 may further store light reflection patterns and relative locations of the fiducial 201, the SEMI standard characters 204, the SEMI T7 mark 208, or other etched patterns (including dot patterns) expected to found etched into the front surface or back surface transparent substrates.

The computer-readable storage medium 728 may also be used to store instructions 726 and/or fiducial-related measurement values as discussed herein above. While the computer-readable storage medium 728 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium other than a carrier wave that is capable of storing or encoding a set of instructions for execution by the machine and that cause the machine to perform any one or more of the methodologies described herein. The term "computer-readable storage medium" shall accordingly be taken to include, but not be limited to, the non-transitory media including solid-state memories, and optical and magnetic media.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
   a substrate support on which to receive a transparent substrate;
   a rotator attached to the substrate support;
   a laser detector pair to identify a fiducial in an edge of the transparent substrate;
   an optical character recognizer adapted to detect a dot pattern etched proximate to the fiducial on a surface of the transparent substrate; and
   a processing device coupled to the rotator, to the laser detector pair, and to the optical character recognizer, the processing device to:
      direct the rotator to rotate the transparent substrate until the laser detector pair detects the fiducial;
      direct the optical character recognizer to scan an area of the transparent substrate that is proximate to the fiducial until detecting the dot pattern at a location relative to the fiducial;
      determine, based on the location, whether a front surface of the transparent substrate is facing up or facing down; and
      direct a robot to transfer the transparent substrate to a processing chamber dependent on whether the front surface of the transparent substrate is facing up or facing down.

2. The system of claim 1, wherein, to determine that the front surface of the transparent substrate is facing up, the processing device is to detect that the dot pattern is located to a first side of the fiducial.

3. The system of claim 2, wherein the first side is a right side of the fiducial.

4. The system of claim 2, wherein, to determine that the front surface of the transparent substrate is facing down, the processing device is to detect that the dot pattern is located to a second side of the fiducial that is opposite to the first side.

5. The system of claim 1, wherein, to determine that the front surface of the transparent substrate is facing up, the processing device is to determine that the location is between three and eight degrees relative to a fiducial axis of the fiducial.

6. The system of claim 1, wherein, to determine that the front surface of the transparent substrate is facing down, the processing device is to determine that the location is between negative three and negative eight degrees relative to a fiducial axis of the fiducial.

7. The system of claim 1, wherein the processing device is further to:
   detect that the transparent substrate is incorrectly flipped on the substrate support; and
   direct the robot to first transfer the transparent substrate to a flipping station before being sent to the processing chamber.

8. The system of claim 1, wherein the dot pattern is a SEMI T7 mark.

9. The system of claim 1, wherein the fiducial is a notch.

10. A system comprising:
    a substrate support on which to receive a transparent substrate;
    a non-contact sensor adapted to detect and image a dot pattern etched on a surface of the transparent substrate; and
    a processing device attached to the non-contact sensor, the processing device to:
       determine, using imaging data from the non-contact sensor, an orientation of a right-angled edge of the dot pattern;
       determine, based on the orientation of the right-angled edge, whether a front surface of the transparent substrate is facing up or facing down; and
       direct a robot to transfer the transparent substrate to a processing chamber dependent on whether the front surface of the transparent substrate is facing up or facing down.

11. The system of claim 10, wherein, to determine that the front surface of the transparent substrate is facing up, the processing device is to determine the orientation of the right-angled edge is at a left of the dot pattern.

12. The system of claim 10, wherein, to determine that the front surface of the transparent substrate is facing down, the processing device is to determine the orientation of the right-angled edge is at a right of the dot pattern.

13. The system of claim 10, wherein the processing device is further to:
    detect that the transparent substrate is incorrectly flipped on the substrate support; and
    direct the robot to first transfer the transparent substrate to a flipping station before being sent to the processing chamber.

14. The system of claim 10, where the non-contact sensor comprises one of a camera, a depth sensor, or an image scanner.

15. The system of claim 10, wherein the dot pattern is a SEMI T7 mark.

16. A method comprising:
    scanning, using a non-contact sensor of an aligner, a surface of a transparent substrate to locate SEMI standard characters etched into one of a front surface or a back surface of the transparent substrate;
    attempting to read, using an optical character recognizer of the aligner, the SEMI standard characters;
    determining, using a processing device coupled to the optical character recognizer, whether the SEMI standard characters are non-mirrored;
    determining, using the processing device, whether the surface of the transparent substrate is the front surface of the transparent substrate depending on whether the SEMI standard characters are non-mirrored; and
    directing, using the processing device, a robot to transfer the transparent substrate to a processing chamber dependent on whether the front surface of the transparent substrate is facing up or facing down.

17. The method of claim 16, wherein the SEMI standard characters are mirrored when the front surface of the transparent substrate is facing down.

18. The method of claim 16, further comprising determining that an orientation of the transparent substrate on a substrate support of the aligner is correct before sending the transparent substrate to the processing chamber.

19. The method of claim 16, further comprising:
    determining an orientation of the transparent substrate based on whether the front surface of the transparent substrate is facing up;

accessing event output data associated with the orientation of the transparent substrate; and determining a process sequence for the transparent substrate based on information listed in the event output data.

20. The method of claim 16, further comprising:

determining an orientation of the transparent substrate based on whether the front surface of the transparent substrate is facing up;

determining that the orientation is incorrect; and directing the robot to first transfer the transparent substrate to a flipping station before sending the transparent substrate to the processing chamber.

* * * * *